United States Patent

Kawada et al.

Patent Number: 5,309,049
Date of Patent: May 3, 1994

[54] ALTERNATING CURRENT MAGNETIC LEVITATION TRANSPORT SYSTEM

[75] Inventors: Noriyuki Kawada; Shigeki Morii; Motomi Nakashima; Jin Yamada, all of Hiroshima, Japan

[73] Assignee: Mitsubishi Jukogyo Kabushiki Kaisha, Tokyo, Japan

[21] Appl. No.: 53,300

[22] Filed: Apr. 26, 1993

Related U.S. Application Data

[63] Continuation of Ser. No. 740,154, Aug. 5, 1991.

[51] Int. Cl.⁵ ............................................. H02K 41/00
[52] U.S. Cl. ...................................... 310/12; 198/619
[58] Field of Search ............... 335/209, 296, 300; 198/619, 805; 104/281-286; 310/12, 13

[56] References Cited

U.S. PATENT DOCUMENTS

| | | | |
|---|---|---|---|
| 3,675,757 | 7/1972 | Yabuta | 310/12 X |
| 4,013,906 | 10/1977 | Eastham | |
| 4,518,078 | 5/1985 | Garrett | 198/619 X |
| 4,540,326 | 9/1985 | Southworth et al. | 198/619 X |
| 4,766,993 | 8/1988 | Kita et al. | 198/619 |
| 4,877,123 | 10/1989 | Fukuwatari | 198/619 |

FOREIGN PATENT DOCUMENTS

| | | |
|---|---|---|
| 0005331 | 11/1979 | European Pat. Off. |
| 2325327 | 11/1974 | Fed. Rep. of Germany |
| 2545293 | 11/1984 | France |
| 240647 | 10/1986 | Japan ...... 198/619 |
| 257828 | 11/1986 | Japan ...... 198/619 |
| 299119 | 12/1989 | Japan ...... 198/619 |
| 299120 | 12/1989 | Japan ...... 198/619 |
| 299121 | 12/1989 | Japan ...... 198/619 |
| 0856871 | 8/1981 | U.S.S.R. ...... 198/619 |

OTHER PUBLICATIONS

J. L. Nikolajsen, A Magnetic Bearing Based on Eddy-Current Repulsion, Jan. 1987.
C. B. Rajanathan, Prof. D. A. Lowther, Prof. E. M. Freeman, Finite-element Analysis of the Xi-core Levitator, Jan. 1984.
Patent Abstracts of Japan, vol. 10, No. 291 (M-522) (2347) Oct. 3, 1986 & JP-A-61 106 329 (NEC Kansai Ltd.) May 24, 1986.

Primary Examiner—Leo P. Picard
Assistant Examiner—Raymond Barrera
Attorney, Agent, or Firm—McAulay Fisher Nissen Goldberg & Kiel

[57] ABSTRACT

An alternating current magnetic levitation transport system transporting a floating body made of conductive paramagnetic or nonmagnetic metallic material being levitated over alternating current electromagnets by making use of repulsion of an alternating electromagnetic field, comprises a tubular passage provided over the alternating current electromagnets which are spatially cut off from the outside wherein the floating body is levitated and transported. A cooling system made of a conjoined body of a thermoelectric cooling thermomodule and a liquid-cooled heat exchanger is provided in the transport system in contact with said tubular passage. This system can be favorably used in a clean environment where dust generation has to be avoided and the system can thereby provide more efficient transportation.

2 Claims, 8 Drawing Sheets

ALTERNATING CURRENT MAGNETIC LEVITATION TRANSPORT SYSTEM

This is a continuation of application Ser. No. 07/740,154, filed Aug. 5, 1991.

BACKGROUND OF THE INVENTION

1. Field of the Invention

The present invention relates to a preferred transport apparatus or system to be used in the field in which an uncontacted transport of objects is required, such as a wafer transport equipment in a semiconductor production line wherein dust generation has to be avoided, a vacuum transport system wherein scattering of lubricant has to be prevented, and a transportation apparatus to be used in a high temperature atmosphere or the like. More specifically, the present invention relates to an alternating current magnetic levitation, transport system in which an object to be transported is mounted on a floating body and the floating body made of a conductive paramagnetic or nonmagnetic metallic material is floated and transported in a system over alternating current electromagnets disposed in rows.

2. Description of the Related Art

Conventionally, what is called a magnetic bearing composed of permanent magnets or electromagnets has been used as a bearing for a transport or transfer mechanism for objects (such as semiconductor wafer) in, for example, a semiconductor production process line wherein dust generation or scattering of lubricant is detested. In this system an object to be transported or supported is floated over a clearance without contacting anything by means of magnetic attraction or repulsion working between magnets or between a magnet and a magnetic material. As for the mechanisms of this kind, various researches and developments have been made and many of them have already been put in actual use.

However, among them magnetic bearings making use of electromagnets have such drawbacks as that they require control circuits for stabilizing intrinsically unstable attraction of magnets by means of electrical control although they have an advantage of small electric power consumption, or that many attachments, such as necessary gap sensors, are required. Especially, these control circuits have to be provided over the entire transport line in the case of a long distance transportation.

As a means to avoid the above-mentioned drawbacks, a necessary circuit and sensors may be mounted on a transported object. However, in this case a power source, such as batteries or the like, is required on the object and further a major problem occurs with respect to equipment that a charge or power supply system newly becomes necessary for operation over an extended period of time.

On the other hand, use of magnetic repulsion, in principle, makes the above-mentioned control devices unnecessary and has a great advantage as a transportation mechanism for a long distance in terms of the required equipment.

However, it is generally believed that a repulsion levitation mechanism composed of permanent magnets only is practically impossible, and at least one or more axes of its degrees of freedom must be stabilized by means of the above-mentioned control circuits.

Figure 11A:
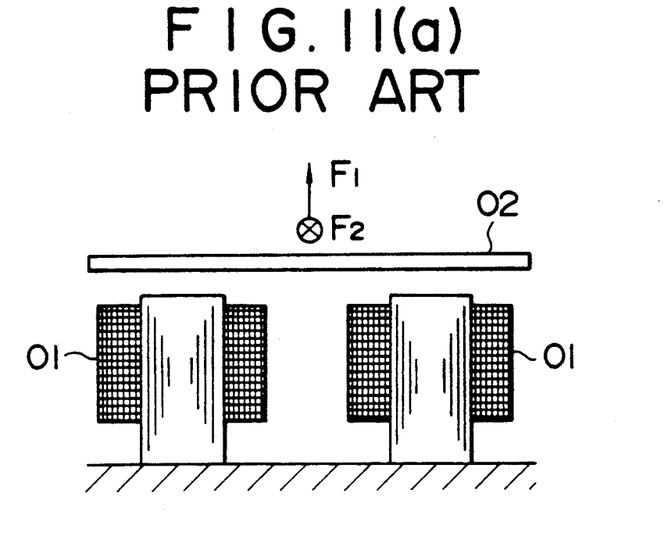
FIGS. 11(a), (b), and (c) are respectively a front view, a side view and a plan view showing one example of the alternating current magnetic levitation transport system of the prior art.
Figure 11B:
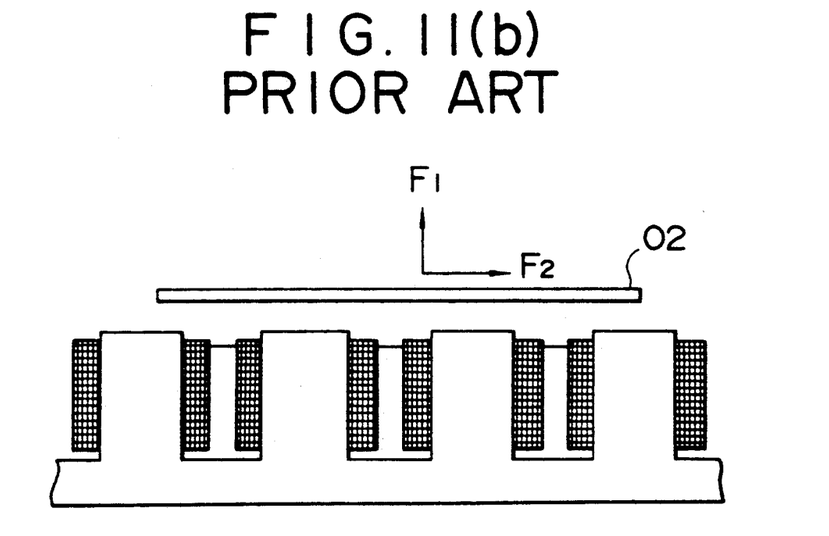
Figure 11C:
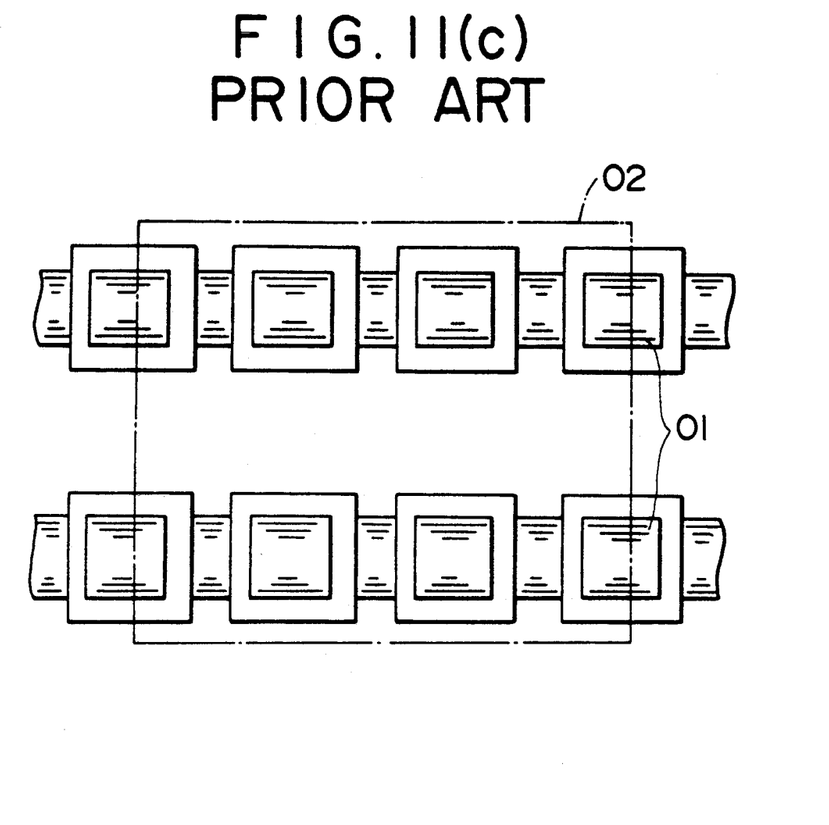

On the contrary, it is theoretically confirmed that an inductive repulsion method using alternating current electromagnets can stably float and support objects by devising appropriate forms of floating bodies made of conductive materials. FIG. 11 shows such a method. In FIG. 11 (a) through (c), reference numeral 01 denotes an alternating current electromagnet, and 02 a floating body to be transported, for which a light and highly conductive material such as aluminum is suitable. An object desired to be transported is usually placed on this floating body 02.

In the composition illustrated in FIG. 11, when an alternating current flows in the aforementioned alternating current electromagnet 01, an alternating magnetic field is generated above the magnet. Because the floating body 02 is in this magnetic field, an alternating current called as an eddy current flows in the material (aluminum) of the floating body 02. The magnetic field generated due to this overcurrent is formed exactly in the repulsive direction to the magnetic field generated by the electromagnet, so that due to this repulsion a floating force indicated as F1 in the figure acts on the floating body 02.

Then the floating body 02 can be driven by means of a driving force F2 exerted thereon. This force F2 is produced by linear motor mode driving of the electromagnets disposed in rows as shown in FIG. 11 (b) and (c).

Figure 12:
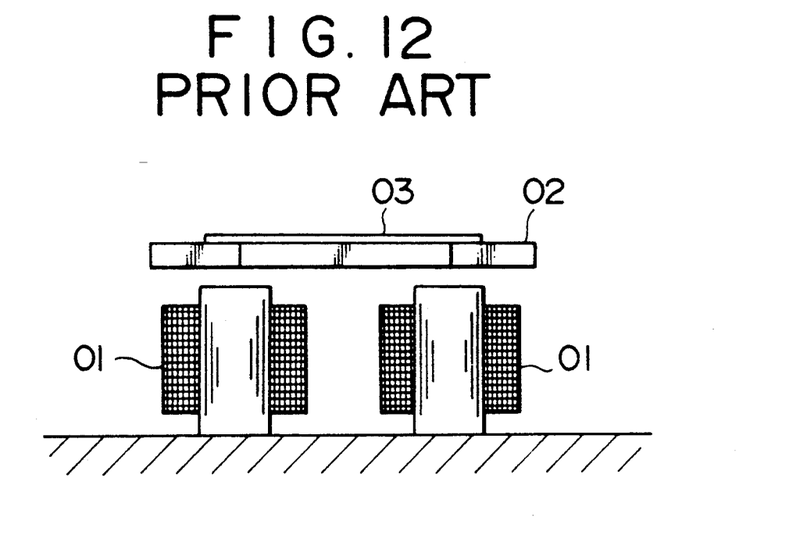
FIG. 12 is a front view showing an alternating current magnetic levitation transport system of the prior art transporting an object.

In FIG. 12, an object 03 to be transported is mounted on the floating body 02 in the apparatus shown in FIG. 11.

Described above is the transportation principle of an alternating current repulsion system. However, when this alternating current repulsion system is applied to vacuum transportation, such as in the wafer transport equipment in the semiconductor production system in which dust generation has to be avoided, it has previously been necessary to take such a measure as covering and fixing the electromagnets with resin to protect the dust generation from the electromagnets because the floating body transport passage and electromagnets are disposed in the same area. However, even if this protection measure is taken, it is deemed difficult to maintain a high grade vacuum because of a gas released from the resin when the above-mentioned electromagnets are placed in a vacuum atmosphere.

Further, the alternating current magnetic levitation transport system as shown in FIG. 11 and FIG. 12 has a problem of heat generation due to an electric current flowing in the floating body 2. As is generally known heat generation Q in a metal due to an electric current is given by $$Q = I^2 R, \text{ or } Q = E^2/R$$

where,
Q = heat generated,
I = electric current,
E = electromotive force (voltage), and
R = electric resistance.

Therefore, the temperature of the floating body 02 is changed when the heat equivalent to the heat generated (Q) is not removed. The temperature of the floating body 02 is elevated when the heat removal is insufficient, causing a thermal damage to the transporting object 03 or a thermal deformation and damage to the floating body 02, and normal operation becomes impossible.

As described above, the utilization of an inductive repulsion system using alternating current electromagnets for the vacuum transportation, such as the wafer transport equipment in the semiconductor production system in which dust generation is disliked, conventionally requires the countermeasures, such as, a means against dust generation or gas release from electromagnets, a means against heat generation in the electromagnets due to an electric current flowing therein, and a means against heat generation in the floating body caused by an induced electric current due to electromagnets. Especially, gas release from the electromagnets causes, in the case of a wafer transport equipment, for example, the composition of the wafer surface to deteriorate, resulting in a fatal yield reduction in the production of semiconductors while higher integration of semiconductor elements is now in progress.

Also, it is possible to cool a heated floating body by a cooled heat transfer surface. However, when transporting operation is restarted by turning on the alternating current electromagnets and the floating body is floated, the temperature of the floating body increases again, thereby the floating body needs to be cooled again by stopping the transporting operation. The smaller the frequency of operation stoppage is and the less the cooling (operation stoppage) time for cooling the floating body is, the better the operation performance of the system becomes. Therefore, further improvement of the cooling technology is required.

SUMMARY OF THE INVENTION

The present invention has been developed for meeting the above-mentioned requirements and it is an object of the present invention to provide an alternating current magnetic levitation transport system of high practical use which requires no countermeasure against dust generation and gas release from electromagnets, and countermeasures against the heat generation of the electromagnets and that of the floating body are easy.

Another object of the present invention is to provide an alternating current magnetic levitation transport system, of which operation stoppage frequency and cooling (operation stoppage) time for cooling the floating body can be reduced by improving the cooling performance for the floating body, thereby the operation performance of the system can be improved.

In the alternating current magnetic levitation transport system of the present invention, wherein the floating body made of conductive paramagnetic or nonmagnetic metallic material is floatingly transported by making use of an alternating magnetic field of alternating current electromagnets, a tubular passage is provided in the direction of the transport over the electromagnets disposed also in the direction of the transport and is made of nonmetallic material, such as ceramic, or paramagnetic metallic material preferably having an electric resistance not less than five times that of the floating body, whereby the floating body and an object to be transported which is mounted thereon are floated and transported within the above-mentioned tubular passage, so that the passage of the floating body and the location of the electromagnets are spatially cut off from each other.

Therefore, countermeasures against dust generation and gas release from the electromagnets are not needed and heat generation of the electromagnets can be controlled. Moreover, when the floating body is heated due to the alternating magnetic field and needs to be cooled, it is possible to quickly remove the heat of the floating body via the tubular passage wall by making the floating body land on and make contact with the bottom of the tubular passage by turning off the magnetic field and halting the levitation of the floating body.

Additionally, the present invention is characterized in that, under the floating body transported in floatation over the rows of the electromagnets of the alternating current magnetic levitation transport system, a group of conjunct bodies of thermoelectric cooling thermomodules and liquid cooling heat exchangers are provided under the rows of electromagnets so as to increase the cooling capacity of the system for the floating body by the combined effects of the thermomodules and exchangers.

According to the characteristics of the present invention, it is possible to assemble the transport system in such a way that the heat exchanger is conjoined to the heat radiation side of the thermomodule, and the floating body which is not in the floating and transportable condition can be directly contacted with the heat absorption side of the thermomodule (if no tubular passage is provided), or the floating body can be indirectly contacted with the same (if the tubular passage is provided). Also, the temperature of the heat absorption side becomes lower than that of the refrigerant due to the function of the thermomodule when electric current is supplied to the thermomodule and a refrigerant flows into the heat exchanger.

This temperature difference depends on an electric current density supplied to the thermomodule, a flow-through heat energy, performance of the thermomodule. However, there are some data showing that the temperature of the absorption side is, 0° C. for a single stage module and not more than $-30°$ C. for a three stage module in the case where the heat radiation side is cooled by air of 50° C. (Japanese magazine "DENSIGIJUTU", Dec. 1985, article entitled "Netsuden Reikyaku Debaisu (Thermoelectric Cooling Device)" by Kinichi Uemura). Usually the heat transfer coefficient of air in convection is small; however, in the present invention the heat exchanger is conjoined to the heat radiation side of the thermomodule and the refrigerant is circulated on the heat radiation side so as to obtain a large heat transfer rate. Therefore, due to the complex effect produced by this high heat transfer rate combined with the thermomodule effect, the cooling performance for the floating body can be remarkably improved compared with that of the prior art.

DETAILED DESCRIPTION OF THE PREFERRED EMBODIMENTS

Embodiments of the present invention will be described in the following referring to the drawings.

Figure 1:
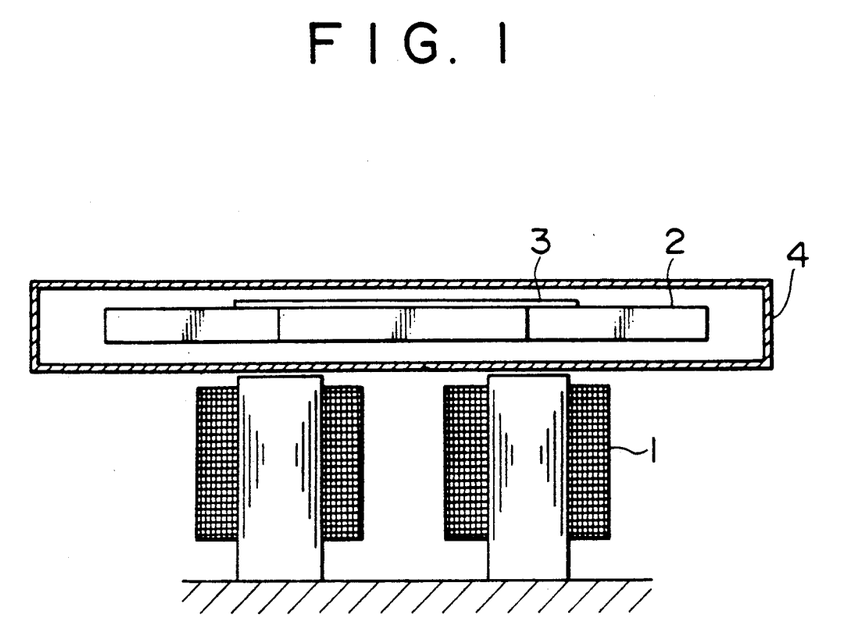
FIG. 1 is a sectional view showing a basic composition of the alternating current magnetic levitation transport system related to the first embodiment of the present invention.

FIG. 1 shows a basic composition of a first embodiment of an alternating current magnetic levitation transport system related with the present invention.

In FIG. 1, reference numeral 1 denotes an alternating current electromagnet, 2 a floating body made of conductive paramagnetic or nonmagnetic metallic material, 3 an object to be transported being mounted on the floating body 2, and 4 a tubular passage forming an essential structural element of the invention.

In the alternating current magnetic levitation transport system of the present invention shown in FIG. 1, the floating body 2 made of a conductive paramagnetic or nonmagnetic metallic material is floated and transported by making use of an alternating magnetic field of the alternating current electromagnet 1, a tubular passage 4 is provided in the direction of the transport over the electromagnets disposed also in the direction of the transport and is made of nonmetallic material, such as ceramic, or paramagnetic metallic material preferably having an electric resistance not less than five times that of the floating body, whereby the floating body 2 and the object 3 to be transported which is mounted thereon are floated and transported inside the above-mentioned tubular passage 4, so that the floating body transport route and the location of the electromagnets are disposed are spatially cut off from one another.

In addition, as for the metallic material forming the above-mentioned tubular passage 4, the numerical value of "5 times" mentioned as a preferable embodiment has been obtained experimentally and is necessary for the electromagnetic field generated by the electromagnet 1 to pass through the wall of the tubular passage 4 and sufficiently exert its effect to the conductive floating body 2. Namely, when this value is much smaller than the above-mentioned value, an overcurrent is generated in the above-mentioned tube wall by the effect of the alternating magnetic field, and the magnetic field reaching the floating body 2 is remarkably decreased due to the repulsion of this eddy current. This is undesirable from the view point of obtaining the primary objective function. Further, the ferromagnetic metallic tube material is not appropriate according to the same reason.

Figure 2:
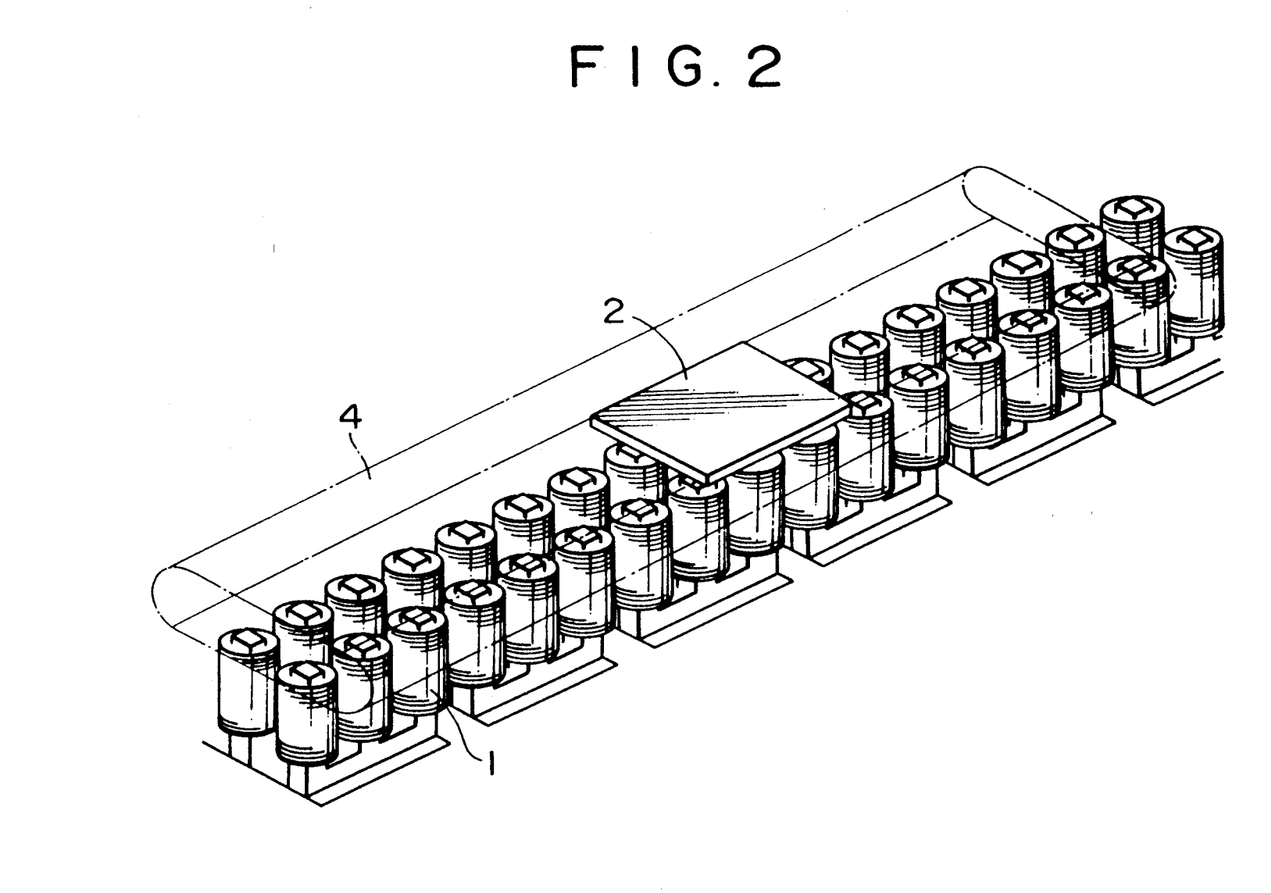
FIG. 2 is a perspective view showing the composition of the first embodiment of the present invention.

FIG. 2 is a perspective view showing a composition of the alternating current magnetic levitation transport system according to the first embodiment of the present invention.

In FIG. 2, when an alternating current flows in the alternating current electromagnet 1, an alternating magnetic field is generated above the magnet and almost all the magnetic fluxes reach the floating body 2 in the tubular passage 4 passing through the thickness of the tubular passage 4 because the tubular passage 4 in the magnetic field is made of nonmetallic or paramagnetic metallic material. Further, an alternating current called as eddy current flows in the floating body 2 made of highly conductive material due to this fluxes, while the eddy current scarcely flow in the tubular passage 4 made of low conductive material. The magnetic field generated due to this eddy current is formed exactly in the repulsive direction to the magnetic field generated by the electromagnet, thereby a repulsive force occurs between the floating body 2 and the electromagnet 1 while no repulsion takes place between the tubular passage 4 and the electromagnet 1. Therefore the floating body 2 floats upward in the tubular passage 4 with the total weight of both the floating body 2 and the object 3 to be transported balancing the above-stated repulsive force.

The tubular passage 4 is basically closed. It can be connected at a part thereof to an exhausting equipment such as a vacuum pump (not shown) to keep its inside at a necessary low pressure. Especially, when the present invention is applied to a transport system in which the generation of dust whose size is on the order of micro meters has to be avoided, such as wafer transport in a semiconductor production line, the inside of the tubular passage 4 should preferably be maintained in vacuum. This is because the object 3 to be transported can be kept cleaner by making the inside of the tubular passage 4 a vacuum atmosphere.

The attached drawings show examples of straight line transportation; however, curves or diverging points can also be properly provided.

As mentioned above, the tubular passage 4 is provided over the rows of the electromagnets (1,1,---) installed in the direction of the transport of the floating body 2, the above-mentioned floating body 2 is floated and transported inside the above-mentioned tubular passage 4 and the transportation route of the floating body 2 and the location of the electromagnets 1,1,--- are spatially separated from each other, thereby only the inside of the tubular passage 4 may be kept in vacuum and used for the transport of the floating body, such as wafer transport in the semiconductor production system in which dust generation has to be prevented, and because the location of the electromagnets 1,1,--- can be under atmospheric pressure, countermeasures against dust generation and gas release from the electromagnets 1,1,--- are not needed and countermeasures against heat generation of the electromagnets 1,1,--- due to the electric current in the electromagnets 1,1,--- are easy to take.

Here, the outer wall of the tubular passage 4 is kept in contact with air and is air-cooled mainly by convection, and the temperature of the outer wall is lower than that of the floating body 2.

However, the floating body 2 is floated. Therefore, because the floating body 2 is not in contact with the tubular passage 4, and the tubular passage 4, its inside being kept in vacuum though it is air-cooled, can hardly remove the heat generated in the floating body 2 in connection with the floating force. This is because heat transfer by convection from the floating body 2 to the tubular passage 4 cannot be expected in a vacuum condition and heat transfer by radiation is small at temperatures not more than about 300° C. Therefore, the rate of temperature rise in the floating body 2 becomes high in the vacuum atmosphere.

Considering the above circumstances, a cooling method of the floating body 2, such as the one described in the following, can be employed.

Figure 3:
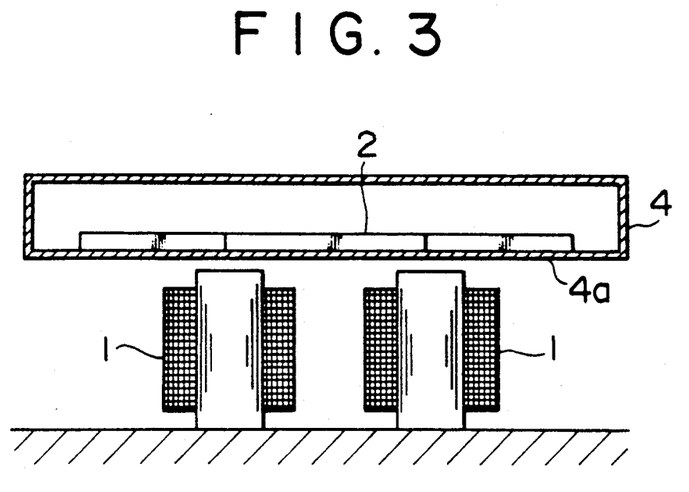
FIG. 3 is a sectional view for explaining the cooling of the floating body in the first embodiment.

With the method shown in FIG. 3, electric current in the alternating current electromagnet 1 is cut when the temperature increases in the floating body 2. Then the floating body 2 goes down by gravity losing the floating force and contacts an air-cooled low temperature underside wall (tubular passage bottom wall) 4a of the tubular passage 4. In the state of this contact, the high temperature heat of the floating body 2 transfers to the low temperature tubular passage bottom wall 4a by contact heat transfer, thereby the cooling of the floating body 2 becomes possible.

Namely, the floating body 2 is heated due to the eddy current flowing therein, while the tubular passage 4 is not heated as the eddy current hardly flows therein. Therefore, the floating body will be rapidly cooled when the levitation of the floating body is stopped.

When the floating body 2 has been cooled to an appropriate temperature, transport operation is commenced again by supplying electric current to the electromagnet 1 to levitate the floating body 2.

Figure 4:
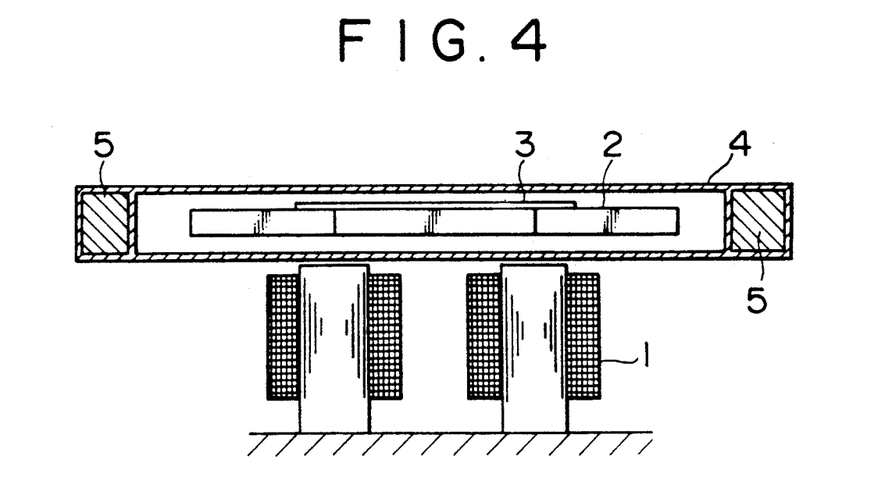
FIG. 4 is a sectional view showing the basic composition of the second embodiment of the present invention.

FIG. 4 shows a second embodiment of the present invention including a cooling means.

In the composition shown in FIG. 4, a cooling water jacket 5 is provided in the tubular passage 4 to cool the tubular passage 4 and the electromagnet 1.

Thus by providing the cooling water jacket 5 to the tubular passage 4, it becomes possible to control the heat generation of the electromagnet 1 and quickly remove the heat of the floating body 2 through the wall of the tubular passage by turning off the alternating magnetic field so as to stop the levitation of the floating body and let it come into contact with the bottom wall of the tubular passage, when the floating body is heated due to the alternating magnetic field and cooling is required.

Figure 5:
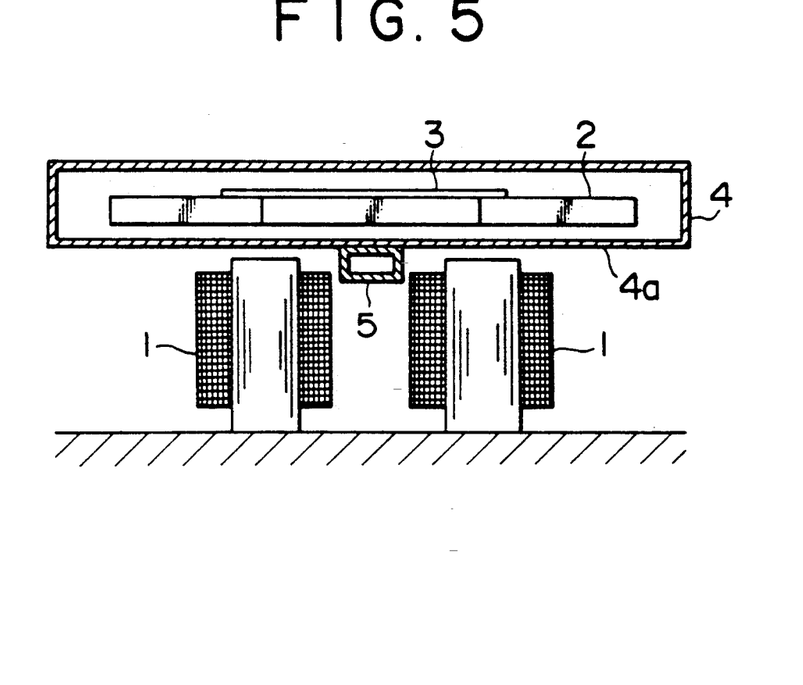
FIG. 5 is a sectional view showing the basic composition of the third embodiment of the present invention.

Moreover, as exemplified by a third embodiment of the present invention shown in FIG. 5, a heat exchanger 5 in which flowing water (cooling water) serves as a refrigerant can be provided under the tubular passage 4 so as to cool the passage. Thus the cooling of the floating body 2 using the tubular passage bottom wall 4a can be improved; namely, the cooling rate of the floating body 2 due to contact heat transfer can be improved. This cooling technology is also applicable to a system in which the tubular passage 4 is not evacuated and to the basic alternating current magnetic levitation transport system shown in FIG. 11 and FIG. 12.

Figure 6:
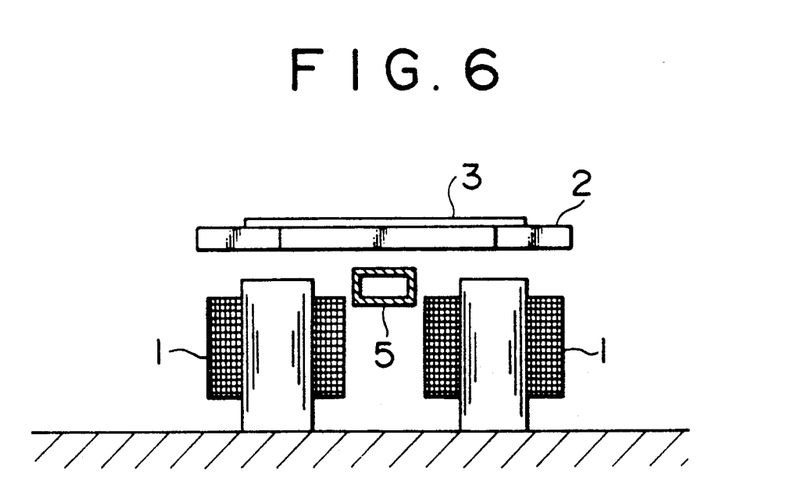
FIG. 6 is a sectional view showing the cooling equipment of the third embodiment applied to the prior art.

As shown in FIG. 6, it is also practical to apply the cooling means of FIG. 5 to a conventional alternating current magnetic levitation transport system.

The above-mentioned cooling means is suitable for cooling the floating body 2; however, the operation of the transport system has to be stopped even though the stoppage is provisional. The less the frequency of the operation stoppage like this is, the more it is desirable, and the operation stoppage time should also be shortened as much as possible.

To meet the requirements of this kind, the cooling means such as the ones described in the following can be adopted.

Figure 7:
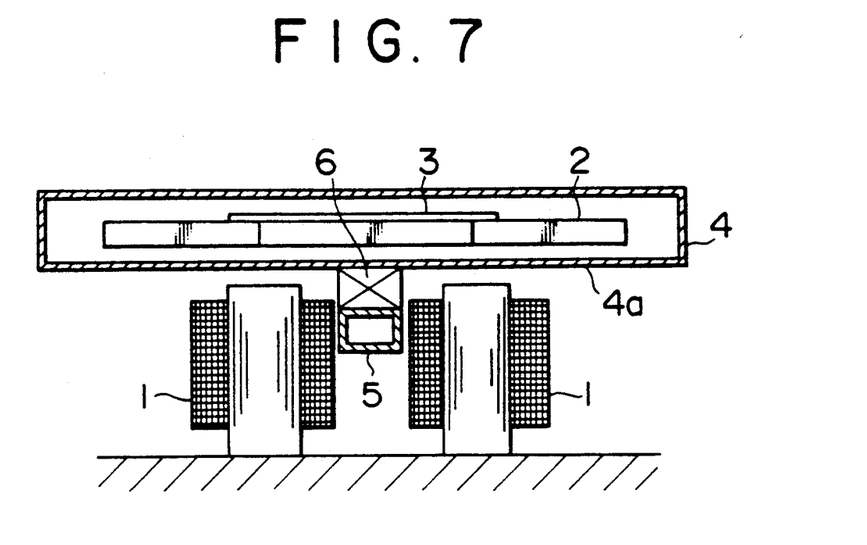
FIG. 7 is a sectional view showing the basic composition of the fourth embodiment of the present invention.

FIG. 7 is a sectional view showing the basic composition of a fourth embodiment of the present invention. The composition shown in FIG. 7 represents a further improvement over the third embodiment shown in FIG. 5. In FIG. 7, reference numeral 1 denotes an alternating current electromagnet, 2 a floating body made of conductive paramagnetic or nonmagnetic metallic material, and 3 an object to be transported being mounted on the floating body 2. Reference numeral 4 represents a tubular passage provided over and along the rows of the electromagnets 1 to form a levitation transport route of the floating body 2. The tubular passage 4 is basically closed, and in the present embodiment it is connected to an exhaust equipment (not shown), such as a vacuum pump, so as to keep the inside thereof at a required low pressure. Reference numeral 5 denotes a circulating refrigerant cooling plate heat exchanger (liquid-cooled heat exchanger) provided under the tubular passage 4, and 6 a heat cooling thermomodule provided between the tubular passage 4 and the heat exchanger 5. The thermomodule 6 is disposed so that its heat absorption surface is in contact with the under surface of the tubular passage 4 (tubular passage bottom wall 4a) and its heat radiation surface is in contact with the upper surface of the heat exchanger 5 to form a conjoined body with the heat exchanger 5.

In FIG. 7, a power cable to supply power to the electromagnet 1 and the thermomodule 6, and a refrigerant supply tube to supply refrigerant to the heat exchanger 5 are omitted.

The above-mentioned thermomodule 6 is well known of its function to perform thermoelectric cooling by means of thermoelectric semiconductor elements; therefore, detailed description of its composition and function is omitted here.

The present embodiment utilizes the characteristics of the thermomodule 6 that the temperature of the heat absorption surface of the thermomodule 6 can be set much lower than that of the refrigerant when heat in the thermomodule 6 is transferred from its radiation surface to the refrigerant side of the heat exchanger 5 and the temperature of the radiation surface is lowered close to the refrigerant temperature. It is clear that the lower the temperature of the heat absorption surface of the thermomodule 6 is, the lower is the temperature of the tubular passage bottom wall 4a of the tubular passage 4 which is in contact therewith, thereby the cooling performance cooling the floating body 2 is improved.

Then the thermomodule 6 can be driven by direct electric current supplied thereto, and the heat exchanger 5 by a refrigerant flowing therein.

Figure 8:
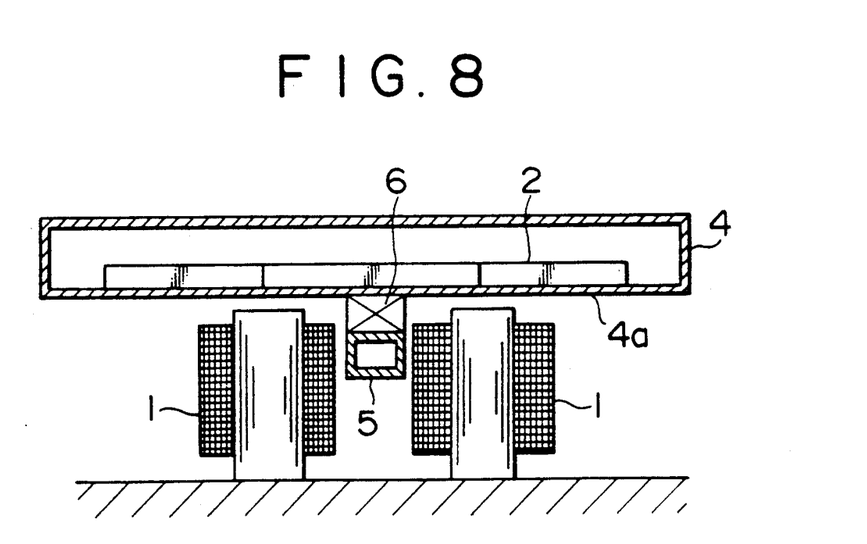
FIG. 8 is a sectional view for explaining the cooling of the floating body in the fourth embodiment.

Now in the composition of FIG. 7, the floating body 2 can be cooled by cutting off the power supply to the alternating current electromagnet 1 and withdrawing the floating force exerted onto the floating body 2, so as to bring the floating body 2 into contact with the tubular passage bottom wall 4a of the tubular passage 4 as shown in FIG. 8. That is, by suspending the transport operation of the floating body 2 and letting it ground in the tubular passage 4 so as to bring it into contact with the tubular passage bottom wall 4a, the heat in the floating body 2 can be transferred to the tubular passage bottom wall 4a mainly by way of contact heat transfer. According to this procedure, the temperature of the floating body 2 can be reduced.

As is clear from the principle of heat transmission, it is also true in this case that the larger the temperature difference is, the larger the heat transfer rate becomes. Therefore, in the present embodiment wherein the temperature of the tubular passage bottom wall 4a of the tubular passage 4 can be set remarkably low, the operation suspension time required to cool down the floating body 2 can be shortened.

Further, the frequency of the transport operation stoppage can be reduced because the floating body 2 can be cooled to a lower temperature compared with the cooling method applied in the above-mentioned third embodiment.

Figure 9:
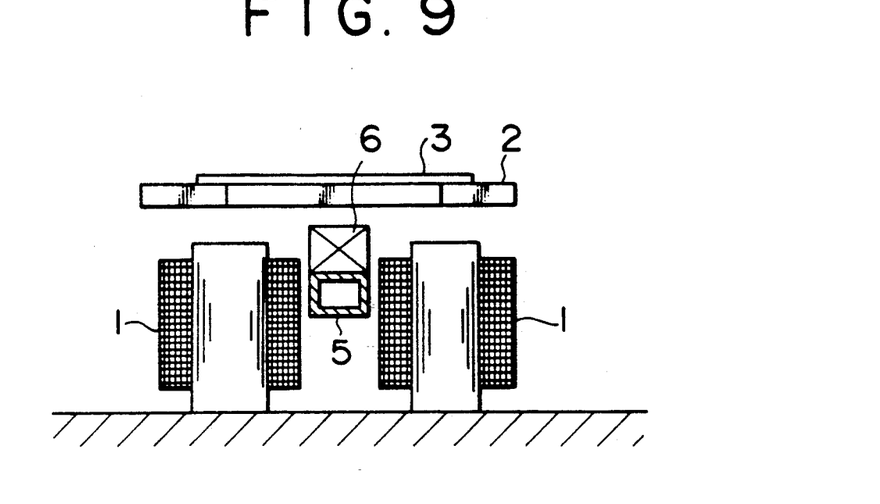
FIG. 9 is a sectional view showing the basic composition of the fifth embodiment of the present invention.

Moreover, the cooling method for the floating body 2 utilizing a conjoined composition of the thermomodule 6 and the heat exchanger 5 is applicable to a conventional alternating current magnetic levitation transport system without the tubular passage 4 shown in FIG. 12. An example of this is shown in FIG. 9. In the composition of FIG. 9, the conjoined body of the thermomodule 6 and the heat exchanger 5 is disposed so that the floating body 2 would land on the conjoined body (more specifically, the heat absorption surface of the thermomodule 6). The function of the composition in FIG. 9 and that of the alternating current magnetic levitation transport system in FIG. 7 are the same except that the floating body 2 comes in direct contact with the absorption surface of the thermomodule 6 for cooling of the floating body 2 after the levitation transport thereof is stopped (in FIG. 7, the floating body is in-indirect contact through the tubular passage bottom wall 4a of the tubular passage 4).

Figure 10:
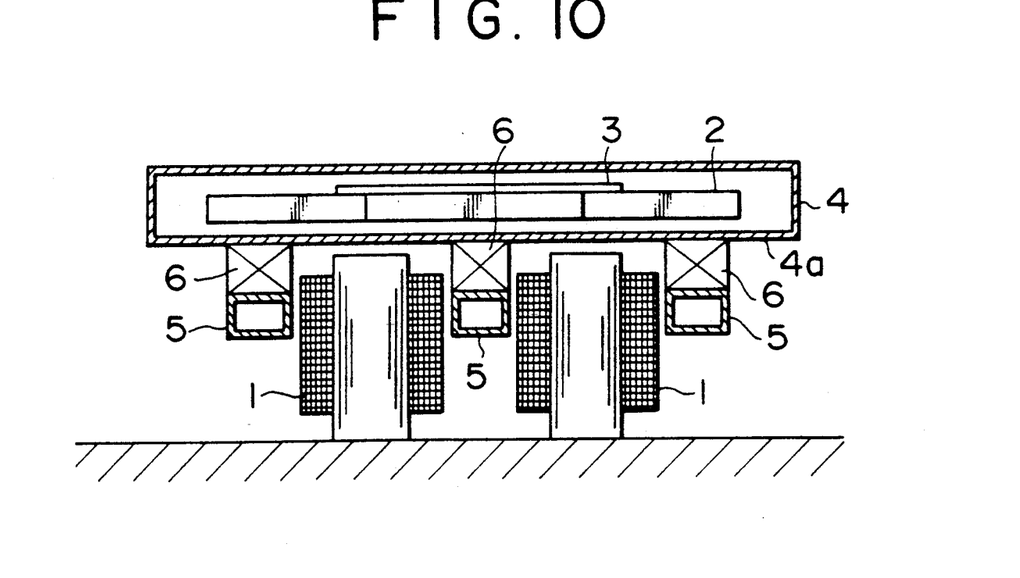
FIG. 10 is a sectional view showing the basic composition of the sixth embodiment of the present invention.

The above-mentioned description is made for the case in which a pair of the thermomodule 6 and the heat exchanger 5 is provided; however, it is possible to equip a plurality of pairs as shown in FIG. 10. FIG. 10 shows an example wherein two additional pairs of the thermomodule 6 and the heat exchanger 5 are installed in the composition of FIG. 7 to further improve the cooling performance.

Also, the thermomodule 6 can be used in the form of multicascade. Furthermore, the refrigerant of the heat exchanger 5 is not limited to water, such as so called "cooling water", used in the composition of FIG. 5 and FIG. 6, but various kinds of refrigerant, such as brine and hydrocarbons, can be used, and the kind and temperature of the refrigerant are not restricted.

As described above in detail, the present invention is constituted in such a way that, in the alternating current magnetic levitation transport system thereof, the floating body made of conductive paramagnetic or nonmagnetic metallic material is floated and transported by making use of an alternating magnetic field generated by alternating current electromagnets, a tubular passage is provided over the electromagnets disposed in the direction of the transport, the above-mentioned floating body is floated and transported within the above-mentioned tubular passage so that the floating body transportation route and the location of the electromagnets are spatially cut apart from each other. Thus countermeasures against dust generation and gas release from the electromagnets are not needed, and heat generation of the electromagnets can be controlled. Moreover, when the floating body is heated due to the alternating magnetic field and needs to be cooled, it is possible to quickly remove the heat of the floating body through the contact with the tubular passage wall by turning off the magnetic field and halting the levitation of the floating body so as to land the floating body on the bottom of the tubular passage.

In addition, even if the system is used in a high temperature atmosphere, expensive electromagnets for high temperature use become unnecessary in the present invention by designing the system so that only the inside of the tubular passage will be exposed to such a high temperature atmosphere, thereby a low cost transport system becomes possible.

Further to increase the cooling efficiency for the floating body, the alternating current magnetic levitation transport system in which the floating body made of conductive paramagnetic or nonmagnetic metallic material is floatingly transported over the rows of the alternating current electromagnets can be constituted so that the conjoined body of a thermoelectric cooling thermomodule and a liquid-cooled heat exchanger is disposed along the rows of the electromagnets under the floating body. In the construction described above, by means of the combined effect of the above thermomodule and heat exchanger, the temperature of the surface on the floating body side of the above conjoined body can be set remarkably lower than that of the refrigerant in the heat exchanger. Namely, the performance of cooling the floating body is remarkably improved so that the suspension frequency of the transport operation is reduced and cooling (operation stoppage) time is shortened, resulting in a further improvement in the effective operation performance of the system.

We claim:

1. An alternating current magnetic levitation transport system, comprising:
   (a) a series of alternating current electromagnets;
   (b) supply means for supplying alternating current to said alternating current electromagnets to create an alternating electromagnetic field;
   (c) a tubular passage of at least one material selected from the group consisting of nonmetallic material and paramagnetic metallic material, positioned over said electromagnets;
   (d) a floating body of a material selected from the group consisting of conductive paramagnetic metallic material and conductive nonmagnetic metallic material, within said tubular passage being repelled, levitated and transported by said electromagnetic field; and,
   (e) cooling means for cooling the interior of said tubular passage, wherein said cooling means comprises a conjoined body of thermoelectric cooling thermodule and a liquid-cooled heat exchanger.

2. The transport system according to claim 1, wherein said thermoelectric cooling module is a multistage thermoelectric cooling module.

* * * * *